(12) United States Patent
Ota et al.

(10) Patent No.: US 8,020,745 B2
(45) Date of Patent: Sep. 20, 2011

(54) SOLDER BALL

(75) Inventors: Ryo Ota, Hitachi (JP); Takeyuki Itabashi, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 12/620,781

(22) Filed: Nov. 18, 2009

(65) Prior Publication Data

US 2010/0127044 A1 May 27, 2010

(30) Foreign Application Priority Data

Nov. 18, 2008 (JP) ................................ 2008-294066

(51) Int. Cl.
*B23K 35/14* (2006.01)
*B23K 31/02* (2006.01)

(52) U.S. Cl. ........................ 228/56.3; 228/246; 148/24

(58) Field of Classification Search .................. None
See application file for complete search history.

(56) References Cited

U.S. PATENT DOCUMENTS

| | | | | |
|---|---|---|---|---|
| 5,690,271 | A * | 11/1997 | Dudel | ........................ 228/254 |
| 6,387,499 | B1 | 5/2002 | Sohma et al. | |
| 7,413,771 | B2 * | 8/2008 | Arora et al. | ................... 427/216 |
| 2005/0196949 | A1 * | 9/2005 | Iwata et al. | ................... 438/613 |
| 2007/0090160 | A1 * | 4/2007 | Masumoto | ................... 228/101 |
| 2007/0111381 | A1 * | 5/2007 | Iwata et al. | ................... 438/106 |
| 2007/0181218 | A1 * | 8/2007 | Sakamoto et al. | .............. 148/25 |
| 2008/0299394 | A1 * | 12/2008 | Arora et al. | ................... 428/407 |
| 2009/0008432 | A1 * | 1/2009 | Onozaki et al. | ............... 228/222 |
| 2010/0090334 | A1 * | 4/2010 | Masumoto | ................... 257/693 |

FOREIGN PATENT DOCUMENTS

| | | |
|---|---|---|
| JP | 11-267885 A * | 10/1999 |
| JP | 2000-288771 | 10/2000 |
| JP | 2000-288771 A * | 10/2000 |
| JP | 3503523 | 12/2003 |
| JP | 2004-216403 | 8/2004 |
| JP | 2005-021975 A * | 1/2005 |
| JP | 2005-254246 | 9/2005 |
| JP | 4068973 | 1/2008 |

OTHER PUBLICATIONS

Derwent-ACC-No. 1989-236967.*
Machine translation of JP-2005-021975A (no date available).*

* cited by examiner

*Primary Examiner* — Kiley Stoner
(74) *Attorney, Agent, or Firm* — Antonelli, Terry, Stout & Kraus, LLP.

(57) ABSTRACT

An object of the present invention is to improve a yield of electronic devices in a ball mounting process by preventing a micro-bonding and change in color of the solder balls, and to improve a bonding reliability of the solder balls by reducing an oxide film on a surface of the solder ball. The solder ball has a surface thereof coated with an organic compound containing a cyclic structure and an aliphatic hydrocarbon group.

6 Claims, No Drawings

SOLDER BALL

CLAIM OF PRIORITY

The present application claims priority from Japanese patent application serial No. 2008-294066, filed on Nov. 18, 2008, the content of which is hereby incorporated by reference into this application.

BACKGROUND OF THE INVENTION

1. Field of the Invention

The present invention relates to solder balls.

2. Description of Related Art

In recent years, electronic devices have increased in communication speed and capacity, and become multifunctional and portable at a rapid pace. The advance of surface mount technology (ball grid array (BGA)/chip scale package (CSP)) of a package for a semiconductor integrated circuit or the like has improved fine wiring and multiple pins, thus leading to increase in communication speed and portability.

Unlike conventional bonding methods using a metal lead frame, such as a quad flat package (QFP) or a small outline package (SOP), the BGA/CSP technology involves forming bumps using solder balls, and then directly soldering a package onto a printed wiring board via the bumps in many cases.

A ball mount type bump formation technique is in a mainstream of the bump formation techniques in which solder balls are mechanically mounted on a package substrate by a ball mounter, and then reflowed thereby to form solder joints. In the ball mount, the solder balls are vacuum-sucked by a dedicated jig, and a flux is applied to the balls or the substrate. Then, the solder balls are mounted on the substrate. After appearance inspection, a reflow process is performed.

In such a ball mount process, the balls to be mounted may be micro-bonded together and not sucked by the mounting jig, or the balls may be attached to the mounting jig at the same time to cause a defective condition or the like. The micro-bonding of the solder balls is caused by triboelectric charging.

Detection of the solder balls is performed using an optical detector after mounting the solder balls. The optical detection generally involves bringing the ball into focus while the surface of the ball is shiny. The element Sn or Pb will be oxidized to have its color changed, which promotes the etiolation of the surface of the ball. The progress of oxidation of the solder ball, and of the etiolation of the surface may disadvantageously cause malfunction of the optical detector for detection of the mounted balls, which results in a decrease in yield.

A technique for prevention of the color change of the solder balls is disclosed in Japanese Patent No. 3503523. In the technique, an aliphatic hydrocarbon lubricant, such as stearic acid or stearic acid amide, or a higher aliphatic amide lubricant is diluted with a solvent, and then the solder balls are immersed in the lubricant, so that the solder balls have the surfaces thereof coated therewith. This prevents friction and triboelectric charging of the solder balls due to swinging or vibration during transportation or mounting of the solder balls, thereby to prevent the change in color. The surface treatment technique has effects of improving the lack of the bonding strength and contamination of an area near a position for a solder bump formation.

The above patent document, however, does not specifically describe a surface treatment agent other than the stearic acid and stearic acid amide. The surface treatment using such kinds of limited organic compounds cannot sufficiently prevent the change in color of the solder balls, and has difficulty in completely preventing mounting errors from being caused by the micro-bonding between the solder balls due to the triboelectric charging as described above. Further, in order to achieve mounting at high density, a pitch of electrodes on a substrate has become fine, and the diameter of a solder ball has decreased, which may cause problems, including micro-bonding and the like. From the viewpoint of background described above, it is difficult for the related art to address the foregoing problems.

In recent years, a lead-free solder ball has been in the mainstream owing to a restriction of hazardous substances (RoHS) command that went into effect in 2006, instead of the conventional Sn—Pb based solder. Alloy components for the solder ball in use include an Sn—Ag based alloy, an Sn—Ag—Cu based alloy and the like. Decrease in amount of Ag of the alloy component, or use of Sn—Zn based component has been recently studied because of a rise in the price of rare metal.

The Pb-free solder composition has poor wettability as compared with the Sn—Pb based solder. A high reflow temperature promotes the oxidation of the solder balls to reduce the wettability, which causes the problems associated with the reliability of bonding.

Thus, a process for coating the surface of the solder ball requires a surface treatment which is adapted to suppress the friction of the solder ball for preventing the change in color of the solder balls, and to deoxidize an oxide film on the surface of the solder ball, thereby removing the oxide film.

Accordingly, it is an object of the present invention to improve the yield of electronic devices in a ball mounting process by preventing the micro-bonding and change in color of the solder balls, and to improve the bonding reliability of the solder balls by reducing an oxide film on the surface of the solder ball.

SUMMARY OF THE INVENTION

A solder ball according to the present invention has a surface thereof coated with an organic compound containing a cyclic structure and an aliphatic hydrocarbon group.

The organic compound is a sorbitan fatty acid ester, a vitamin or a vitamin derivative which has the cyclic structure and aliphatic hydrocarbon group.

The present invention can prevent the micro-bonding of the solder balls due to the triboelectric charging thereof, and prevent the change in color of the solder balls due to the oxidation of the surface of the solder ball, thereby improving the yield of the electronic devices in the ball mounting process. Additionally, the oxide film on the surface of the solder ball is reduced, which can improve the reliability of bonding between the solder balls.

The present invention can prevent the excessively adhesion of the solder balls to the ball mounting jig.

The present invention can prevent the malfunction of a device for detection of the mounted solder balls, and thus can improve the yield of the electronic devices.

DETAILED DESCRIPTION OF THE PREFERRED EMBODIMENTS

The present invention relates to a solder ball for bonding which is adapted to mount electronic components to a wiring board.

A solder ball of one embodiment of the present invention is used not only for a BGA/CSP application which uses the balls having a grain size of 1000 μm (micrometer) or less, but also as a micro-ball of about 10 to 100 μm in bonding forms of a semiconductor package, such as a flip-chip bonding. A lead-free solder composition is in the mainstream of a solder composition, and may be a Sn—Ag based, Sn—Ag—Cu based, Sn—Zn—Bi based, Sn—Cu based, Sn—Ag—In—Bi based, Sn—Zn—Al based, Sn—Cu—Ni—Ge based one or the like. Japan Electronics and Information Technology Industries Association (JEITA) recommends an Sn-3.0Ag-0.5Cu composition as a standard one. In recent years, three-dimensional mounting based on the BGA has been considered as means for achieving a higher packaging density. The three-dimensional mounting forms include CoC (Chip on Chip), PoP (Package on Package) and the like. In such cases, normal solder balls cannot ensure a space between laminated packages, chips, or electrodes becomes very short pitch, which presents the problem of short circuit between bonded parts of the solder balls in the reflow process. For this reason, a metal core solder ball or resin core solder ball having excellent thermal conductivity, electric conductivity and standoff (attachment height) effect has attracted increasing attention. The technique of the present invention can also be applied to such metal core or resin core solder ball. In particular, the copper core solder ball is used as the metal core solder ball in many cases.

Now, features of a solder ball in an embodiment of the present invention will be described below.

The solder ball of the embodiment of the present invention has a surface thereof coated with an organic compound containing a cyclic structure and aliphatic hydrocarbon group.

The organic compound is a sorbitan fatty acid ester, a vitamin or a vitamin derivative containing the cyclic structure and aliphatic hydrocarbon group.

The vitamin derivative is represented by the following general formula (1) or (2) (in which $R^1$ to $R^7$ indicate a hydrogen element or an aliphatic hydrocarbon group having a carbon number of 8 to 20, and in which at least one of $R^1$ to $R^4$ is a hydrocarbon group, or at least one of $R^5$ to $R^7$ is a hydrocarbon group).

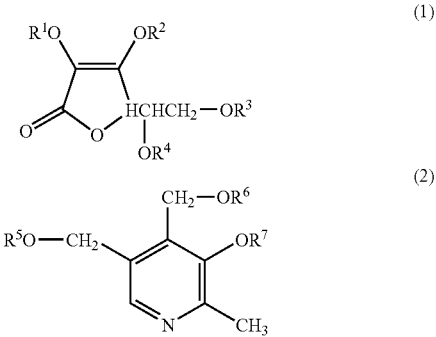

The vitamin derivative is an ascorbic acid derivative, a pyridoxic acid derivative or a mixture thereof.

The vitamin derivative is ascorbic acid dipalmitate, pyridoxic acid dipalmitate or a mixture thereof.

The amount of coating of the vitamin derivative is preferably in a range of 0.03 to 50 mg/m².

The vitamin is preferably vitamin A, vitamin E or vitamin K.

The surface treatment agents for the solder ball can include the following materials, for example.

Sorbitan fatty acid esters having a cyclic structure and an aliphatic hydrocarbon group include sorbitan monolaurate, sorbitan sesquilaurate, sorbitan trilaurate, sorbitan monomyristate, sorbitan sesquimyristate, sorbitan trimyristate, sorbitan monopalmitate, sorbitan sesquipalmitate, sorbitan tripalmitate, sorbitanmonostearate, sorbitan sesquistearate, sorbitan tristearate, sorbitan monooleate, sorbitan sesquioleate, sorbitan trioleate, sorbitan monoarachidate, sorbitan sesquiarachidate, sorbitan triarachidate and the like. The sorbitan fatty acid ester has a molecular structure formed by the bond between a sorbitan having a cyclic structure and a fatty acid ester having an aliphatic hydrocarbon group.

The vitamins or vitamin derivatives containing the cyclic structure and the aliphatic hydrocarbon group include retinol, retinal and retinoic acid as the vitamin A, tocopherol and tocotrienol as the vitamin E, phylloquinone, menaquinone and menadione as the vitamin K, pyridoxine monocaprylate, pyridoxine dicaprylate, pyridoxic acid monopalmitate, and pyridoxic acid dipalmitate as the vitamin $B_6$ derivative, ascorbic acid monopalmitate, ascorbic acid dipalmitate, ascorbic acid monostearate, ascorbic acid distearate, ascorbic acid tetraisopalmitate, ascorbyl tetra-hexyldecanoate as the vitamin C derivative, and the like. A mixture of these compounds may be used. The vitamin A, the vitamin E and the vitamin K have the cyclic structure and the chain hydrocarbon group within a molecular. The vitamin $B_6$ derivative and the vitamin C derivative each have a molecular structure formed by a bond between the vitamin $B_6$ (pyridoxine) or vitamin C (ascorbic acid) containing the intramolecular cyclic structure, and a fatty acid ester containing the aliphatic hydrocarbon group.

The above-mentioned cyclic structure is preferably a five-membered ring or six-membered ring, but may be a heterocyclic compound containing oxygen, nitrogen or the like, or a cyclic carbon hydride.

The above-mentioned chain hydrocarbon group is a saturated hydrocarbon group or unsaturated hydrocarbon group, and not limited to a specific one, but preferably has a straight-chain structure.

A method for coating the surface of the solder ball with the above compound is, for example, a wet type process which involves immersing solder balls in a solution obtained by diluting the above compound with a solvent. Preferably, the solvent is dried and removed to allow the surface treatment agent to be fixed to the solder ball. The solvent that easily dissolves the compound is preferably a volatile organic solvent, in particular, a polar solvent such as methanol, ethanol, 2-propanol, acetone or 2-butanone.

Alternatively, a spray method may be employed which involves applying a solution to the surface of the solder ball by use of a spray, and drying the solution to coat the surface with the surface treatment agent. A dry type process can also coat the surface of the solder ball, and is, for example, a rotation method which involves thinly applying the compound to an inner wall of a container, and rotating the container with the solder balls accommodated therein thereby to coating the surface of each solder ball with the compound. Any other method for coating the surface of the solder ball with the compound may be employed. Preferably, no unevenness of the coated compounds shows up at the outer appearance of the solder ball, and the solder balls have the uniform properties, including flowability.

The amount of coating with the surface treatment agent is preferably set such that the compounds are applied to the surface area in a range of 0.03 to 50 mg/m² regardless of the size of the solder ball. This coating amount corresponds to 0.2 nm to about 30 nm in thickness of the surface treatment agent which almost covers the whole solder balls.

For the amount of coating of the surface treatment agent of 0.03 mg/m² or less, charging of the solder balls due to friction between the balls cannot be sufficiently suppressed and causes micro-bonding between the balls.

In contrast, for the amount of coating of the treatment agent exceeding 50 mg/m$^2$, the excessive surface treatment agent is precipitated as powder, and the micro-bonding of the solder balls is promoted, which disadvantageously degrades the flowability of the solder balls.

Now, the present invention will be described more specifically based on Examples. The solder balls used in the Examples have an alloy composition of Sn-3.0Ag-0.5Cu (in units of % by weight) manufactured as a standard one by a uniform droplet spray (UDS) method, but the present invention is not limited thereto, and can be applied to solder balls produced by a granulation in oil process or to any other solder balls with other suitable alloy compositions.

Examples 1 to 9

In Examples 1 to 9, the surface treatment was applied to solder balls made of Sn-3.0Ag-0.5Cu and having a grain size of 450 μm, and the flowability of the solder balls was evaluated. The surface treatment agents used were sorbitan monolaurate, sorbitan monopalmitate, sorbitan monostearate, sorbitan tristearate, sorbitan trioleate, retinol, tocopherol, pyridoxic acid dipalmitate and ascorbic acid dipalmitate, respectively. In order to coat the solder balls at a rate of 4.4 mg/m$^2$, the surface treatment agent was dissolved in 2-propanol to produce a treatment solution.

Then, 10 g of the solder balls were sufficiently immersed in 0.8 g of the treatment solution added, and dried in a drying machine at 100° C. (degree C.) for 10 minutes, whereby the solder balls were coated with the surface treatment agent.

The friction between the thus-obtained solder balls was evaluated with reference to a flowability test method defined by JIS Z 2505. Metal funnels with different orifice diameters (whose surface is made of nickel plating) were prepared according to grain sizes of the solder balls. In the Examples, 10 g of the solder balls was poured into the metal funnel. The time during which all the solder balls fell from the funnel was measured to evaluate the flowability of the solder balls. The shorter the time required for the solder balls to fall is, the smaller the friction between the solder balls is. The solder balls having the poor flowability may cause clogging of the funnel while the balls fall through the funnel. The falling time was measured five times, and the average time (seconds) was determined as a flowing time.

In Comparative Examples 1 and 2, untreated solder balls not subjected to the surface treatment, and solder balls coated with stearic acid amide at a rate of 4.4 mg/m$^2$ by the same surface treatment as that in Example 1 were prepared, and the respective flowing times of the solder balls prepared were measured in the same way as Example 1.

The shorter the flowing time is, the higher the degree of fluidity (flowability) is.

Table 1 shows results of Examples 1 to 9 and Comparative Examples 1 and 2. As can be seen from Table 1, the solder ball of Example 1 according to the present invention has improved flowability as compared to the solder ball not subjected to the surface treatment in Comparative Example 1, and thus the friction between the solder balls can be reduced. The solder balls in Comparative Example 1 caused clogging of the orifices twice in measuring the degree of fluidity. In contrast, the solder balls of Examples have improved degree of fluidity, and thus did not cause any clogging.

The solder balls of the Examples in the present invention is found to have a high degree of fluidity (or flowability) and to further reduce the friction therebetween, as compared to the solder ball of Comparative Example 2 coated with stearic acid amide, which is the representative surface coating agent for solder balls as disclosed in examples of Japanese Patent No. 3503523.

TABLE 1

|  |  | Compound name | Coating amount (mg/m$^2$) | Grain size of solder ball (μm) | Flowing time (second) | Occurrence of clogging (number of times) |
|---|---|---|---|---|---|---|
| Examples | 1 | Sorbitan monolaurate | 4.4 | 450 | 17.2 | 0 |
|  | 2 | Sorbitan monopalmitate | 4.4 | 450 | 17.0 | 0 |
|  | 3 | Sorbitan monostearate | 4.4 | 450 | 16.6 | 0 |
|  | 4 | Sorbitan tristearate | 4.4 | 450 | 15.8 | 0 |
|  | 5 | Sorbitan trioleate | 4.4 | 450 | 16.1 | 0 |
|  | 6 | Retinol | 4.4 | 450 | 16.8 | 0 |
|  | 7 | Tocophenol | 4.4 | 450 | 16.7 | 0 |
|  | 8 | Pyridoxic acid dipalmitate | 4.4 | 450 | 16.1 | 0 |
|  | 9 | Ascorbic acid dipalmitate | 4.4 | 450 | 15.8 | 0 |
| Comparative Examples | 1 | None | 0 | 450 | 20.4 | 2 |
|  | 2 | Stearic acid amide | 4.4 | 450 | 18.2 | 0 |

Examples 10 to 15

In Examples 10 to 15, solder balls made of Sn-3.0Ag-0.5Cu and having grain sizes of 30 μm, 70 μm, 250 μm, 300 μm, 450 μm and 1000 μm were subjected to surface treatment, and then the flowability of the solder balls was evaluated. Pyridoxic acid dipalmitate which effectively worked in Example 8 was used as the surface treatment agent. The solder ball was coated with the surface treatment agent at a rate of 4.4 mg/m$^2$ by the above-mentioned method. Evaluation of the flowability of the solder balls was performed by changing the orifice diameter of the funnel and the amount of sampling according to the grain size of the solder ball. The flowing times of the solder balls were measured on the following conditions. For the solder balls of 30 μm in grain size, the orifice diameter of the funnel was 0.2 mm, and the amount of sampling was 0.25 g. For the solder balls of 70 μm in grain size, the orifice diameter of the funnel was 0.3 mm, and the amount of sampling was 0.5 g. For the solder balls of 150 μm in grain size, the orifice diameter of the funnel was 0.7 mm, and the amount of sampling was 1 g. For the solder balls of 300 μm in grain size, the orifice diameter of the funnel was 1.4 mm, and the amount of sampling was 5 g. For the solder balls of 450 μm in grain size, the orifice diameter of the funnel was 2.0 mm, and the amount of sampling was 10 g. For the solder balls of 1000 μm in grain size, the orifice diameter of the funnel was 3.0 mm, and the amount of sampling was 15 g.

In Comparative Examples 3 to 14, solder balls not subjected to the surface treatment and having the same grain sizes as those in the above Examples, and solder balls coated with the surface treatment agent at a rate of 4.4 mg/m² by the same treatment as that of Example 1 were prepared, and then the flowing times of these solder balls were measured using the funnels described in Examples 10 to 15.

Table 2 shows the results of Examples 10 to 15 and Comparative Examples 3 to 14. As can be seen from Table 2, the solder balls of the present invention shown in Examples 10 to 15 have improved flowability, and thus can reduce the friction between the solder balls, as compared to the solder balls of 30 to 1000 μm in grain size which were not subjected to the surface treatment in the Comparative Examples, and the solder balls having the surface coated with stearic acid amide in the Comparative Examples.

Although not described in the above Examples, the surface treatment using pyridoxic acid dipalmitate was applied to the resin core solder ball and the copper core solder ball having a grain size of 300 μm, so that the solder balls were coated with the surface treatment agent at a rate of 4.4 mg/m². Then, the flowing times of the solder balls were measured.

As a result, it has shown that the resin core solder ball subjected to the surface treatment improved the flowability by about 10%, and the copper core solder ball improved the flowability by about 15%, with reference to the flowability of the resin core solder ball not subjected to the surface treatment.

Examples 16 to 25

In Examples 16 to 25, solder balls made of Sn-3.0Ag-0.5Cu and having a grain size of 450 μm were subjected to the surface treatment, and the flowability of the solder balls was evaluated. The surface treatment agents in use were pyridoxine monocaprylate, pyridoxine dicaprylate, pyridoxic acid monopalmitate and pyridoxic acid dipalmitate which were vitamin $B_6$ derivatives, and ascorbic acid monopalmitate, ascorbic acid dipalmitate, ascorbic acid monostearate, ascorbic acid distearate, ascorbic acid tetraisopalmitate and ascorbyl tetra-hexyldecanoate which were vitamin C derivative. The solder balls were coated with the surface treatment agents at a rate of 4.4 mg/m². The flowing times of the solder balls subjected to the above surface treatment were measured in the same way as Example 1.

Table 3 shows the results of Examples 16 to 25. As can be seen from Table 3, the solder balls of the present invention shown in Examples 16 to 25 have improved flowability by coating the solder balls with the vitamin C derivative and vitamin $B_6$ derivative, as compared to the solder ball not subjected to the surface treatment in Comparative Example 1. That is, the friction between the solder balls can be reduced.

The solder balls of the Examples are found to have high flowability and further reduce the friction therebetween as compared to the solder ball of Comparative Example 2 coated with the stearic acid amide which is a typical surface coating agent for the representative solder balls.

TABLE 2

| | | Compound name | Coating amount (mg/m²) | Grain size of solder ball (μm) | Flowing time (second) | Occurrence of clogging (number of times) |
|---|---|---|---|---|---|---|
| Examples | 10 | pyridoxic acid dipalmitate | 4.4 | 30 | 22.1 | 0 |
| | 11 | pyridoxic acid dipalmitate | 4.4 | 70 | 20.4 | 0 |
| | 12 | pyridoxic acid dipalmitate | 4.4 | 150 | 19.2 | 0 |
| | 13 | pyridoxic acid dipalmitate | 4.4 | 300 | 17.8 | 0 |
| | 14 | pyridoxic acid dipalmitate | 4.4 | 450 | 16.7 | 0 |
| | 15 | pyridoxic acid dipalmitate | 4.4 | 1000 | 14.9 | 0 |
| Comparative Examples | 3 | None | 0 | 30 | 24.3 | 1 |
| | 4 | None | 0 | 70 | 22.4 | 1 |
| | 5 | None | 0 | 250 | 21.8 | 2 |
| | 6 | None | 0 | 300 | 21.2 | 1 |
| | 7 | None | 0 | 450 | 20.4 | 2 |
| | 8 | None | 0 | 1000 | 20.2 | 1 |
| | 9 | stearic acid amide | 4.4 | 30 | 23.8 | 1 |
| | 10 | stearic acid amide | 4.4 | 70 | 21.8 | 1 |
| | 11 | stearic acid amide | 4.4 | 150 | 21.1 | 2 |
| | 12 | stearic acid amide | 4.4 | 300 | 20.2 | 1 |
| | 13 | stearic acid amide | 4.4 | 450 | 18.2 | 2 |
| | 14 | stearic acid amide | 4.4 | 1000 | 17.6 | 1 |

TABLE 3

| | | Compound name | Coating amount (mg/m$^2$) | Grain size of solder ball (μm) | Flowing time (second) | Occurrence of clogging (number of times) |
|---|---|---|---|---|---|---|
| Examples | 16 | Ascorbic acid monopalmitate | 4.4 | 450 | 16.8 | 0 |
| | 17 | Ascorbic acid dipalmitate | 4.4 | 450 | 15.8 | 0 |
| | 18 | Ascorbic acid monostearate | 4.4 | 450 | 16.5 | 0 |
| | 19 | Ascorbic acid distearate | 4.4 | 450 | 15.5 | 0 |
| | 20 | Ascorbic acid tetraisopalmitate | 4.4 | 450 | 16.0 | 0 |
| | 21 | Ascorbyl tetra-hexyldecanoate | 4.4 | 450 | 15.9 | 0 |
| | 22 | Pyridoxine monocaprylate | 4.4 | 450 | 17.0 | 0 |
| | 23 | Pyridoxine dicaprylate | 4.4 | 450 | 16.8 | 0 |
| | 24 | Pyridoxic acid monopalmitate | 4.4 | 450 | 16.4 | 0 |
| | 25 | Pyridoxic acid dipalmitate | 4.4 | 450 | 16.1 | 0 |

Examples 26 to 29

In Examples 26 to 29, solder balls made of Sn-3.0Ag-0.5Cu and having grain sizes of 70 μm and 450 μm were subjected to the surface treatment by changing the amount of coating of the surface treatment agent, and the flowability of the solder balls was evaluated. The surface treatment agent in use was ascorbic acid dipalmitate which effectively worked in Example 9, and the amounts of the coating agent was applied to the solder balls at rates of 0.03 to 50 mg/m$^2$ by the above-mentioned method. Evaluation of the flowability of the solder balls was performed on the following conditions. For the solder balls of 70 μm in grain size, the orifice diameter of the funnel was 0.3 μm, and the amount of sampling was 0.5 g. For the solder balls of 450 μm in grain size, the orifice diameter of the funnel was 2.0 mm, and the amount of sampling was 10 g.

In Comparative Examples 15 and 16, the solder balls having the same grain sizes as those in the above Examples were respectively coated with the surface treatment agent at rates of 0.014 mg/m$^2$ and 88.8 mg/m$^2$. The flowing times of the solder balls were measured in the same way as those of the above Examples.

Table 4 shows the results of Examples 26 to 29 and Comparative Examples 15 and 16. As can be seen from Table 4, the solder balls coated in the coating amount of the surface treatment agent of 0.03 to 50 mg/m$^2$ in Examples 26 to 29 have improved the flowability to a great extent, and can reduce the friction between the solder balls, as compared to the solder balls not subjected to the surface treatment in Comparative Examples 1 and 4.

Since the coating amount of the surface treatment agent was small in Comparative Example 15, the flowability was not improved and the clogging was caused.

In contrast, since the coating amount of the surface treatment agent in Comparative Example 16 was excessive, the surface treatment agent not covering the surfaces of the solder balls was observed in the form of powder, and problems including quality control occurs. Coating the solder balls with the excessive surface treatment agent results in reduction in flowability of the sold balls. Thus, the amount of coating of the surface treatment agent over the solder balls is preferably in a range of 0.03 to 50 mg/m$^2$.

TABLE 4

| | | Compound name | Coating amount (mg/m$^2$) | Grain size of solder ball (μm) | Flowing time (second) | Occurrence of clogging (number of times) |
|---|---|---|---|---|---|---|
| Examples | 26 | Ascorbic acid dipalmitate | 0.034 | 70 | 20.7 | 0 |
| | 27 | Ascorbic acid dipalmitate | 3.5 | 70 | 20.5 | 0 |
| | 28 | Ascorbic acid dipalmitate | 13.3 | 70 | 19.8 | 0 |
| | 29 | Ascorbic acid dipalmitate | 44.4 | 450 | 15.8 | 0 |
| Comparative Examples | 15 | Ascorbic acid dipalmitate | 0.014 | 70 | 22.2 | 1 |
| | 16 | Ascorbic acid dipalmitate | 88.8 | 450 | 17.1 | 0 |

Examples 30 and 31

In Examples 30 and 31, solder balls made of Sn-3.0Ag-0.5Cu and having a grain size of 300 μm were subjected to the surface treatment using pyridoxic acid dipalmitate and ascorbic acid dipalmitate as the surface treatment agents, so that the solder balls were coated with the surface treatment agent at a rate of 4.4 mg/m$^2$. A rolling contact test was performed on the solder balls.

In the rolling contact test, 10 g of the solder balls were put in a resin container for preventing electrostatic discharge, and rolled for ten hours at the number of revolutions of 60 min$^{-1}$ under the atmosphere. The degree of etiolation of the solder balls due to the surface oxidation was measured. Normally, the solder ball had its surface coated with the natural oxidation film of about 5 nm in thickness. The rolling contact of the solder balls broke the oxidation film to form a new surface, and then a stronger natural oxidation film was further formed, which caused the change in color due to oxidation. When the solder balls had the color thereof changed to a large extent, the color changed from yellow to black.

In Comparative Example 17, the rolling contact test was performed on untreated solder balls not subjected to the surface treatment and having the same grain size as that in the above Examples, and the degree of etiolation of the solder balls was measured.

Table 5 shows the results of Examples 30 and 31 and Comparative Example 17.

As can be seen from Table 5, the solder balls of the present invention shown in Examples 30 and 31 reduced the friction between the solder balls, and between the solder ball and the container even after the rolling contact test. This shows that the oxidation of the surface of the solder ball hardly proceeds, thereby suppressing the increase in degree of etiolation.

Thus, the optical detector for detection of the solder balls mounted does not malfunction, which can prevent the reduction in yield of the solder balls. Further, since the oxidation of the surface of the solder ball can be suppressed, the solder balls with high reliability can be provided without the shortage of bonding strength due to failure of wettability in the reflow process.

In contrast, since the solder balls not subjected to the surface treatment in Comparative Example 17 greatly increased the etiolation degree after the rolling contact test, they speculated that the surface oxidation of the solder ball proceeded. In such a solder ball, the malfunction of the detector in detection of mounting, the failure of bonding in the reflow process, and the micro-bonding between the solder balls due to the friction not reduced are caused to reduce the yield of the electronic devices.

rate of 4.4 mg/m$^2$. A temperature and humidity cycle test was performed on the solder balls. In the temperature and humidity cycle test, a temperature change test method was performed based on JIS C 0025. The progress of oxidation was evaluated by the etiolation degree of the solder ball after the test.

In Comparative Examples 18 and 19, a temperature and humidity cycle test was performed on untreated solder balls having the same grain size as that of the above Examples and not subjected to the surface treatment, and solder balls having the same grain size as that of the above Examples and subjected to the surface treatment using stearic acid amide. After the temperature and humidity cycle test, the etiolation degrees of the solder balls were measured.

Table 6 shows the results of Examples 32 and 33 and Comparative Examples 18 and 19.

As can be seen from Table 6, the solder balls of the present invention shown in Examples 32 and 33 had the oxidation of the surface thereof suppressed even after the temperature and humidity cycle test, and thus does not promote the etiolation. This is because the hydrophobic surface treatment agent of the solder balls prevents direct contact with vapor to interrupt the progress of oxidation.

Thus, the optical detector for detection of the solder balls mounted does not malfunction, and the reduction in yield of the solder balls can be prevented. Further, the oxidation of the surface of the solder ball can be suppressed. Thus, the solder balls with high reliability can be provided without the shortage of bonding strength due to failure of wettability in the reflow process.

In contrast, the solder ball not subjected to the surface treatment in Comparative Example 18 has the etiolation degree increased to a great extent after the temperature and humidity cycle test. This shows that the surface oxidation of the solder ball proceeded.

As shown in Comparative Example 19, the solder ball using stearic acid amide as the surface treatment agent cannot suppress the oxidation in the temperature and humidity cycle test, and thus increases the etiolation degree. In such a solder ball, the malfunction of the detector in detection of mounting, and the failure of bonding in the reflow process due to the reduction in wettability may be caused, leading to reduction

TABLE 5

| | | Compound name | Coating amount (mg/m$^2$) | Grain size of solder ball (μm) | Etiolation degree Initial stage | Etiolation degree After test |
|---|---|---|---|---|---|---|
| Examples | 30 | Pyridoxic acid dipalmitate | 4.4 | 300 | 3.4 | 3.8 |
| | 31 | Ascorbic acid dipalmitate | 4.4 | 300 | 3.1 | 3.4 |
| Comparative Example | 17 | None | 0 | 300 | 2.9 | 6.2 |

Examples 32 and 33

In Examples 32 and 33, solder balls made of Sn-3.0Ag-0.5Cu and having a grain size of 300 μm were subjected to the surface treatment using pyridoxic acid dipalmitate and ascorbic acid dipalmitate as the surface treatment agent, so that the solder balls were coated with the surface treatment agent at a in yield of the solder balls. The vitamin derivatives used in the above Examples works to reduce the oxide film formed on the surface of the solder ball, has flux properties in the reflow process, and also has a function of improving the wettability of the bonded surface. Thus, the vitamin derivatives can improve the reliability of bonding as compared to the stearic acid amide or the like.

TABLE 6

| | | Compound name | Coating amount (mg/m²) | Grain size of solder ball (μm) | Etiolation degree Initial stage | Etiolation degree After test |
|---|---|---|---|---|---|---|
| Examples | 32 | Pyridoxic acid dipalmitate | 4.4 | 300 | 3.4 | 3.6 |
| | 33 | Ascorbic acid dipalmitate | 4.4 | 300 | 3.1 | 3.6 |
| Comparative Example | 18 | None | 0 | 300 | 2.9 | 6.5 |
| | 19 | Stearic acid amide | 4.4 | 300 | 3.2 | 5.8 |

From the results of the Examples described above, it is found that the solder ball of the present invention suppresses the friction therebetween, and prevents the micro-bonding between the solder balls and between the solder ball and the ball mounting jig due to the triboelectric charging. The solder ball of the present invention works to suppress the oxidation of the surface of the ball thereby, to prevent the change in color of the solder ball. Thus, the solder ball of the present invention can prevent the malfunction of a device for detection of the ball mounted, thereby improving the yield of the electronic devices. Further, the use of the vitamin derivatives as the surface treatment agent can provide the solder ball with improved wettability in the reflow process, and improved reliability of bonding.

The present invention can also be applied to a solder ball for the BGA/CSP and a solder ball for the FC.

What is claimed is:

1. A solder ball having a surface thereof coated with an organic compound containing a cyclic structure and an aliphatic hydrocarbon group, wherein the organic compound is a sorbitan fatty acid ester, a vitamin or a vitamin derivative containing the cyclic structure and the aliphatic hydrocarbon group, wherein the vitamin derivative is represented by the following general formula (1) or (2):

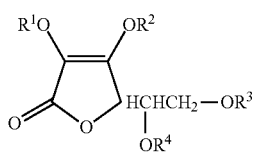
(1)

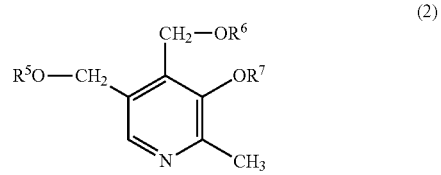
(2)

where R1 to R7 indicate a hydrogen or an aliphatic hydrocarbon group having a carbon number of 8 to 20, and at least one of R1 to R4 is a hydrocarbon group, or at least one of R5 to R7 is a hydrocarbon group.

2. The solder ball according to claim 1, wherein the vitamin derivative is a dipalmitate of ascorbic acid, a dipalmitate of pyridoxic acid, or a mixture thereof.

3. The solder ball according to claim 1, wherein an amount of coating of the vitamin derivative is in a range of 0.03 to 50 mg/m².

4. The solder ball according to claim 2, wherein an amount of coating of the vitamin derivative is in a range of 0.03 to 50 mg/m².

5. The solder ball according to claim 3, wherein a thickness of the coating is from 0.2 nm to about 30 nm.

6. The solder ball according to claim 4, wherein a thickness of the coating is from 0.2 nm to about 30 nm.

* * * * *